United States Patent
Desu et al.

[11] Patent Number: 5,807,774
[45] Date of Patent: Sep. 15, 1998

[54] SIMPLE METHOD OF FABRICATING FERROELECTRIC CAPACITORS

[75] Inventors: Seshu B. Desu; Hemanshu D. Bhatt, both of Blacksburg, Va.; Dilip P. Vijay, Fremont, Calif.

[73] Assignees: Sharp Kabushiki Kaisha, Osaka, Japan; Virginia Tech Intellectual Properties, Inc., Blacksburg, Va.

[21] Appl. No.: 761,804

[22] Filed: Dec. 6, 1996

[51] Int. Cl.$^6$ .................. H01L 21/00; H01L 21/8242; H01L 21/20
[52] U.S. Cl. .................. 438/240; 438/3; 438/393; 438/396
[58] Field of Search .................. 257/310; 438/3, 438/240, 250, 393, 253, 396

[56] References Cited

U.S. PATENT DOCUMENTS

| | | | |
|---|---|---|---|
| 5,407,855 | 4/1995 | Maniar et al. | 438/3 |
| 5,453,347 | 9/1995 | Bullington et al. | 438/3 |
| 5,486,713 | 1/1996 | Koyama | 257/310 |
| 5,536,672 | 7/1996 | Miller et al. | 438/3 |
| 5,554,866 | 9/1996 | Mishioka et al. | 257/310 |
| 5,555,486 | 9/1996 | Kingon et al. | 438/3 |
| 5,581,436 | 12/1996 | Summerfelt et al. | 438/3 |
| 5,593,914 | 1/1997 | Evans, Jr. et al. | 438/240 |
| 5,618,746 | 4/1997 | Hwang | 438/3 |

FOREIGN PATENT DOCUMENTS 7-302888 11/1995 Japan.

*Primary Examiner*—Chandra Chaudhari
*Assistant Examiner*—Toniae M. Thomas
*Attorney, Agent, or Firm*—Davis, Graham & Stubbs LLP

[57] ABSTRACT

A ferroelectric capacitor device and method of manufacture. A substrate supports a bottom electrode structure, with an adhesion/diffusion barrier layer sandwiched therebetween. The electrode layer includes a metal or metal alloy and an oxide of the metal or alloy. The adhesion/diffusion barrier layer is a similar oxide. Ferroelectric material is sandwiched between a top electrode. The top layer includes a metal or metal alloy and an oxide of the same; the metal or metal alloy may be the same as the bottom electrode but need not be. The metal and metal oxide electrodes may be deposited by known deposition techniques, or the metal may be deposited and the oxide formed by annealing in oxygen ambient environment.

14 Claims, 6 Drawing Sheets

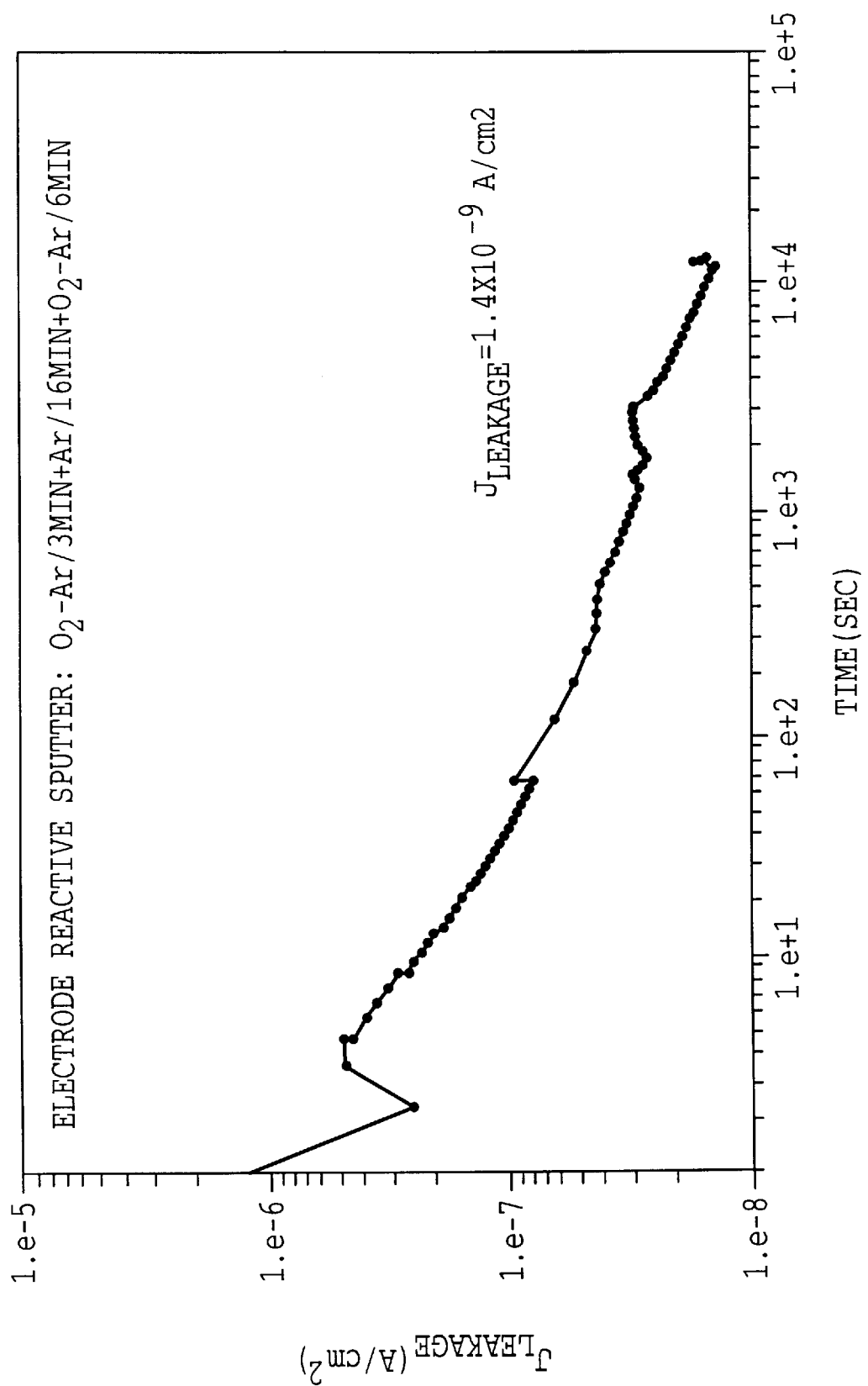

SIMPLE METHOD OF FABRICATING FERROELECTRIC CAPACITORS

FIELD OF THE INVENTION

This invention relates to ferroelectric memory devices, and more particularly to a simple method of fabricating ferroelectric capacitors particularly suited for nonvolatile random access memory applications.

BACKGROUND OF THE INVENTION

Ferroelectrics have long been considered as potential materials for nonvolatile storage of information (see J. F. Scott et al., "Ferroelectric Memories", Science, 1989). These materials exhibit spontaneous polarization that can be reversed by the application of a suitable electric field. The polarization P in these materials responds to an external applied field E in a hysteresis fashion and therefore the materials exhibit two distinct and equally stable states of polarization even after the removal of the electric field. It is this hysteresis feature that makes ferroelectrics suitable for nonvolatile storage of information. The kind of behavior can be used to enable a binary device in the form of a ferroelectric capacitor (electrode/ferroelectric/electrode) in which either of these polarization states are encoded as a "1" or a "0" in the memory device. The ferroelectric capacitors are integrated into the existing Si or GaAs transistor structures to form a one transistor-one capacitor memory cell device; the transistor provides an access to the ferroelectric (ON/OFF switch) capacitor to read/write information However, there are several reliability and processing problems that need to be overcome before a commercially viable product is available. The reliability problems include degradation in properties of the capacitors such as fatigue, aging, high leakage current and imprint. It is now generally agreed that a common source for most of these degradation properties is the interaction between defects in the material and the electrode-ferroelectric interface and/or grain boundaries/domain boundaries in the ferroelectric capacitor (see Desu et al. "Electrochemical Models of Failure in Oxide Perovskites", Physica Staus Solidi, 1992). Therefore, the nature of the electrode-ferroelectric interface is critical in determining several degradation properties of the ferroelectric capacitors such as fatigue, leakage current, imprint, etc. In the processing of the ferroelectric capacitors, the ferroelectric thin film material is grown on top of an electrode thin film. The electrode material, in turn, is grown on a substrate material. The candidate ferroelectric material for nonvolatile memory applications today is lead zirconate titanate (PZT) because of its excellent ferroelectric properties and high Curie temperature. The most widely considered electrode material for memory applications is platinum (Pt). The semiconducting substrate material is usually single crystal Si(100).

The fabrication of Pt/PZT capacitors on Si substrates has its own problems. Platinum, if deposited directly on Si, reacts with the substrate material even at low temperatures to form an undesirable Pt-silicide layer. This necessitates the growth of an intermediate $SiO_2$ barrier layer. However, the adhesion of Pt to $SiO_2$ is very poor and therefore a thin interlayer layer of Ti is normally used between Pt and $SiO_2$. Even with a Ti interlayer, hillock formations are commonly observed on the surface of the Pt films to heights of 50–100 nm. This can be extremely detrimental to the properties of the ferroelectric films on top of the Pt films when deposited in thin layers (about 100 nm). Additionally, it is well known that PZT capacitors with Pt electrodes show a progressive decrease in switched charge with increasing switching cycles (polarization fatigue). Replacement of the Pt electrodes by conducting oxides such as $RuO_2$, La—Sr—Co—O etc. has served in minimizing this problem to a great extent. Additionally, oxide electrodes also adhere well to the $SiO_2$ and therefore there is no need for an interlayer. However, the intrinsic leakage current densities of oxide electrode capacitors are far too high for commercial applications.

Multilayer metal/conducting oxide electrodes have been suggested as a possible means to simultaneously reduce both fatigue and leakage current in PZT thin films. In the few studies conducted, both Pt/LA—SR—CO—O and Pt/$RuO_2$ electrodes have been shown to simultaneously reduce both fatigue and leakage current in PZT thin films. The leakage current levels, however, are still higher than the permissible values for memory applications and therefore need to be improved. Additionally, in these device structures, a thin layer of the oxide electrode (<100 nm) is coated on previously formed Si/$SiO_2$/Ti/Pt substrates and therefore the hillock formation problems mentioned before still persists, often resulting in high leakage currents in very thin PZT films.

From the above discussion, the reliability of the ferroelectric capacitors is critically determined by the device structure of the ferroelectric capacitor, the nature of materials used and the processing of these materials. In this disclosure we describe a simple method of processing a ferroelectric capacitor by which we can simultaneously solve: (a) the adhesion problem of the electrode materials to the substrates and (b) degradation problems such as fatigue and leakage current in ferroelectric thin film capacitors. Additionally. the method also has the advantage of being an in-situ process which is extremely useful in large scale application of these devices.

SUMMARY OF THE INVENTION

It is the general object of this invention to provide a simple method of fabricating a thin film ferroelectric capacitor device. The capacitor of the present invention overcomes the adhesion problem of the capacitor to the underlying substrate. Further, the capacitor of the present invention can overcome the degradation problems of fatigue, leakage current, aging, low voltage breakdown and imprint problems that plague known ferroelectric capacitors.

According to one embodiment of the present invention, in-situ processing of the electrodes obtains a conducting oxide/metal (and/or alloy)/conducting oxide heterostructure on oxidized Si (Si/$SiO_2$) substrates. The first layer of oxide provides the necessary adhesion between the capacitor and the substrate. The subsequent metal (and/or alloy)/conducting oxide provides the necessary multilayer electrode structure for simultaneously overcoming degradation problems such as fatigue, leakage current, low voltage breakdown, aging and imprint.

In one particular embodiment of the present invention the ferroelectric film is laid on top of Si/$SiO_2$/$Rh_2O_3$/Pt—Rh (or Rh)/$Rh_2O_3$ heterosturcture. The starting material for the bottom electrode structure consists of a Pt—Rh (or Rh) alloy target. The electrode system is fabricated on Si/$SiO_2$ substrates using an in-situ three step sputtering process. The first step involves reactive sputtering of the alloy target in an Ar+$O_2$ ambient environment to form a thin $Rh_2O_3$ layer on top of the $SiO_2$ layer. This is followed (second step) by the sputtering of the metallic Pt—Rh layer itself in a pure Ar atmosphere. The third step once again involves sputtering of the alloy target in a reactive $O_2$+Ar atmosphere to form a surface $Rh_xO_y$ layer. A ferroelectric layer such PZT is then deposited on this structure by any one of the known physical or chemical process for thin film deposition. The capacitor structure is completed by in-situ sputtering of multilayer $Rh_2O_3$/Pt—Rh (or Rh) and/or $Rh_2O_3$, in the given sequence once again, to form the top electrode. There are several advantages in using this kind of a device structure for PZT capacitor applications: (a) it obviates the need for any kind of a metallic interlayer such as Ti and thereby prevents any associated hillock formation problems; (b) the multilayer electrode structure is developed by an in-situ process; and (c) the underlying adhesion layer also acts as a diffusion barrier to prevent interdiffusion of the elements of the electrode and the substrate.

BRIEF DESCRIPTION OF THE DRAWINGS

FIG. 6 shows leakage current density values versus time of a device according to an embodiment of the present invention.

DESCRIPTION OF SPECIFIC EMBODIMENTS

Figure 1:
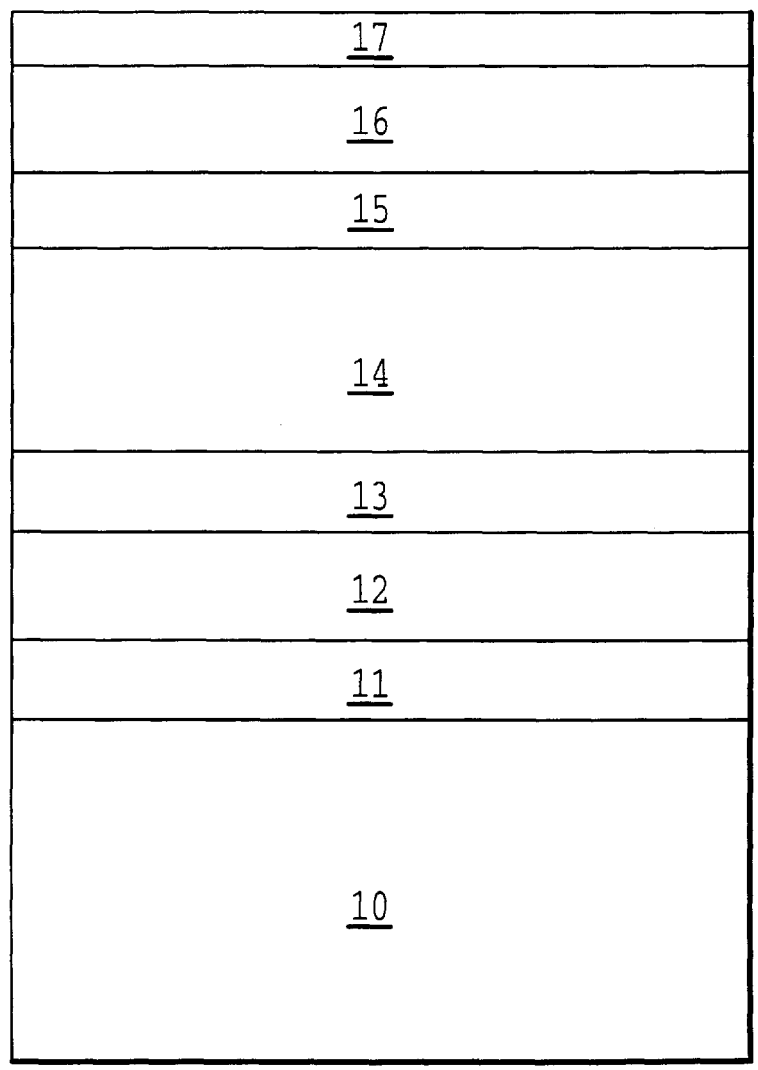
FIG. 1 is a schematic cross sectional representation of an embodiment of the present invention.

Referring to FIG. 1, a ferroelectric device is shown according to one embodiment of the invention. A substrate 10 has the bottom electrode structure (12 and 13) deposited on it to act as a conductor for making connection to other circuit elements in an integrated circuit. The substrate 10 may be a layer of silicon dioxide over a silicon chip. Of course, the substrate may also be bare silicon, gallium arsenide, or a multilayer structure having various circuit elements formed on a silicon chip having layers of silicon dioxide, polysilicon, implanted silicon layers or the like to form a complex integrated circuit. A layer 11 is formed between the substrate 10 and the bottom electrode structure 12 and 13 for adhesion and/or diffusion barrier purposes. The layer 11 is an oxide of one or more components of the metal (and/or alloy) electrode layer 12. Thus, it provides necessary adhesion for the metal to the underlying substrate material. The layer 13 is once again a conducting oxide of one or more components of the metal electrode layer 12. The layers 12 and 13 form a multilayer metal/conducting metal oxide electrode structure for minimization of degradation in ferroelectric films. The electrode layer 12 may be a metal such as Rh, Ir, Ru, Os, Pt, Re, etc. (including all transition elements), and Ag, or an alloy of one or more of these metals such as Pt—Rh, Pt—Ir, Rh—Ir, etc. As used in this application, the word "metal" includes all alloys or other compositions including more than one metal. The term "alloy" may be used additionally, without detracting from the definition of metal above. The layers 11 and 13 are oxides of one or more components of layer 12 such as $Rh_2O_3$ for Rh, $IrO_2$ for Ir, $RuO_2$ for Ru etc. The layers 11, 12 and 13 may be deposited by any one of the known physical or chemical process for deposition of thin films such as sputtering, evaporation, laser ablation, sol-gel method, metalorganic deposition, chemical vapor deposition or any other variations of these processes. In another embodiment of the present invention, the layer 12 is deposited by any one of the methods described above directly on the substrate material and the oxide layers 11 and 13 are formed by annealing in an $O_2$ ambient environment.

The ferroelectric material 14 is deposited on top of the bottom electrode 13 by any viable thin film deposition technique which can provide good uniformity and stoichiometry in the film. The ferroelectric material, in general, is an oxide and possesses a crystal structure belonging to any one of the following classes: perovskite (e.g. PZT), pyrochlore (e.g., $Sr_2Nb_2O_7$), layered perovskite oxide (e.g., $SrBi_2Ta2O_9$) or tungsten bronze. These materials may be deposited by any physical or chemical process for deposition of thin films such as sputtering, evaporation, laser ablation, sol-gel method, metalorganic deposition, chemical vapor deposition or any other variations of these processes. The top electrodes 15 and 16 can either be composed of material which are the same as layers 13 and 12, respectively, in the bottom electrode or a different metal oxide/metal multilayer. For example, the layer 15 could be an oxide of Rh, Ir, Ru, Os, Pt, Re, etc. or an oxide of alloys of one or more of these metals such as Pt—Rh, Pt—Ir, Rh—Ir, etc. The layer 15 is an oxide component of metal layer 16. The layers 15 and 16 may be deposited by any physical or chemical process for deposition of thin films such as sputtering, evaporation, laser ablation, sol-gel method, metalorganic deposition, chemical vapor deposition or any other variations of these processes.

In another embodiment of the present invention, it possible to deposit the layer 16 by any one of the methods described above directly on the ferroelectric material and form oxide layers 15 and 17 by annealing in an $O_2$ ambient environment. The oxide 17 is an optional layer not necessary to the device structure.

An example embodiment of the invention uses PZT as the ferroelectric material, $Rh_2O_3$ as the adhesion layer, Pt—Rh alloy target as the metal electrode layer and $Rh_2O_3$ as the conducting oxide electrode layer. The adhesion layer and the multilayer bottom electrode layers were deposited in-situ by the sputtering process. The sputtering process was conducted in an RF sputtering chamber at a substrate temperature of 450° C. using Pt-10% Rh as the alloy target. The total gas pressure during all the three stages of deposition was maintained at 5 mTorr while the RF power was kept at 50 W. The $O_2$:Ar flow rate ratio used in the first and third stages of the deposition process was 1:4. The Pt-10% Rh sputtering target was 2 inches in diameter and 0.125 inches in thickness; the substrates used were (100)Si with 100 nm $SiO_2$ oxide layer grown on it by thermal oxidation. The total deposition time was maintained at 22 minutes under these conditions. The deposition time for the first layer (adhesion layer) and third layer (oxide layer) was 3 minutes each while the deposition time for the second layer (alloy layer) was 16 minutes. The deposition time for each stage can be varied to obtain any desired thickness of the oxide and metal layers.

Figure 2:
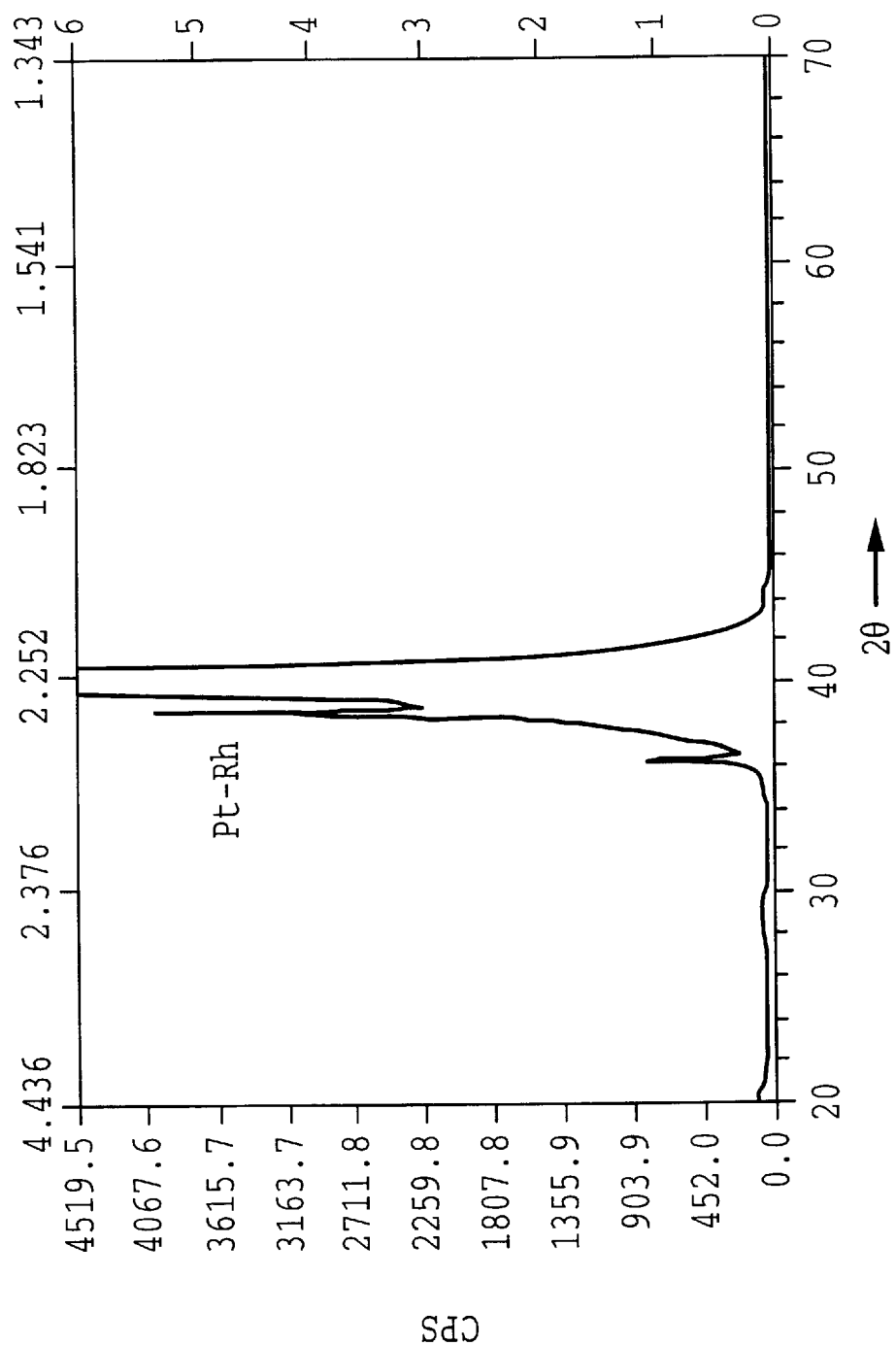
FIG. 2 is graph showing x-ray diffraction analysis of a representative device according to an embodiment of the present invention.

The adhesion of the deposited films to the underlying substrates were tested qualitatively by a tape peel test. None of the films showed any peeling. The x-ray diffraction analysis of the as-deposited films indicated the formation of crystalline Pt—Rh structures under these deposition conditions as seen in FIG. 2. Rutherford backscattering spectrometry (RBS) was used to analyze the composition and thickness of the deposited layers. Analysis showed that the adhesion layer had a thickness of 15 nm and consisted mainly of $Rh_2O_3$, with small amounts (5%) of Pt in it. The intermediate allow layer consisted of Pt with 20% Rh alloyed in it indicating that Rh preferentially sputters relative to Pt. The thickness of this layer was approximately 50 nm. According to RBS, the surface oxide layer (third layer) essentially consisted once again of mainly a 15 nm $Rh_2O_3$ with a small amount of Pt (5%) in it. In effect, these results indicate that the process of invention was successful in obtaining the desired bottom electrode structure and the necessary adhesion to the substrate.

Figure 3:
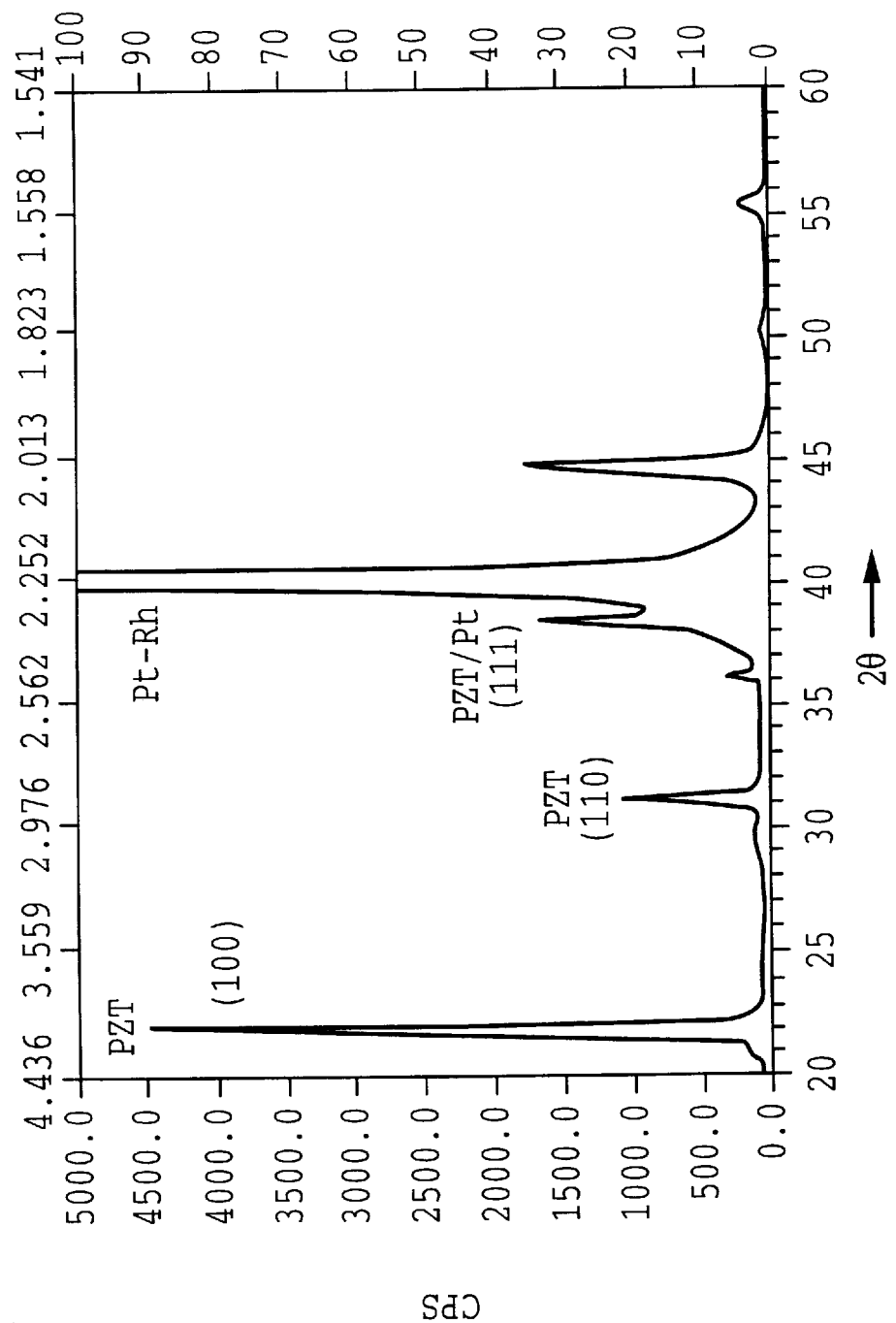
FIG. 3 shows the x-ray diffraction pattern of PZT films annealed on the bottom electrode structure according to an embodiment of the present invention.

PZT films (10% excess lead, Zr/Ti ratio=50/50) were deposited onto these electrodes by the sol-gel spin coating process to a thickness of 300 nm. The as-deposited films were annealed at a temperature of 650° C. for 30 min in an $O_2$ ambient environment to form the desired ferroelectric perovskite phase. FIG. 3 shows the x-ray diffraction pattern of the PZT films annealed under these conditions on the bottom electrode structure described above. Clearly, the perovskite phase formation is complete at this temperature as indicated by the diffraction peaks from the (100), (110) and (111) peaks.

The top $Rh_2O_3$/Pt—Rh multilayer electrodes were deposited once again by reactive sputtering under conditions similar to that of the bottom electrodes. The sputtering process was conducted once again in an RF sputtering chamber at room temperature using Pt-10% Rh (2 inches in diameter, 0.125 inches in thickness) as the alloy target. The total gas pressure was maintained at 5 mTorr while the RF power was kept at 50 W. The $O_2$:Ar flow rate ratio used for the oxide layer deposition was 1:4. The top alloy layer was deposited in pure argon. The deposition times for the top oxide and alloy layers were 3 minutes and 16 minutes respectively. The sputtering process for the top electrodes was done through a contact shadow mask made of stainless steel that contained a circular hole $2.1 \times 10^{-4}$ $cm^2$ in area. The linear distance between the circular holes was approximately 0.5 (center to center).

Figure 4:
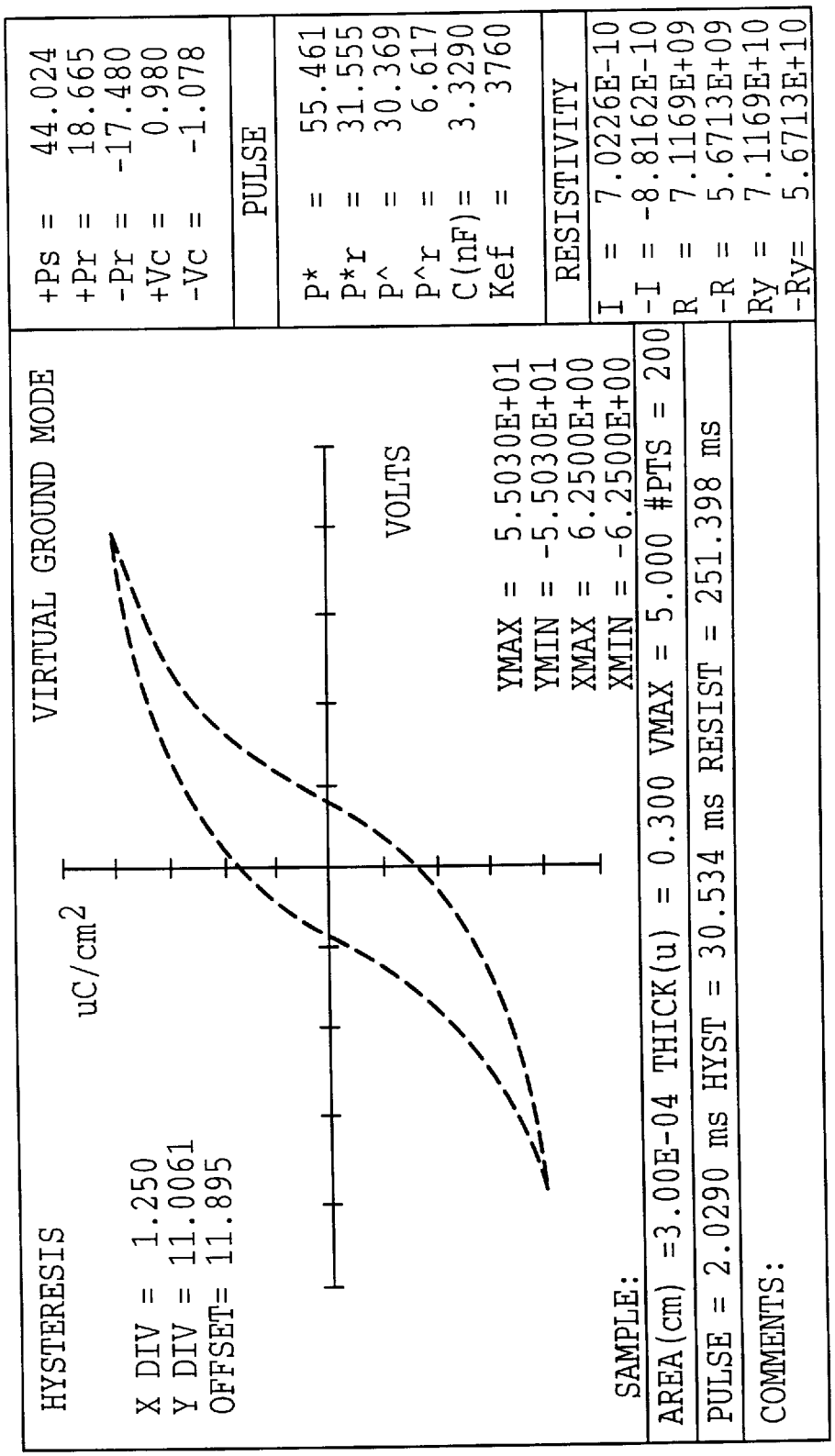
FIG. 4 is a graph showing hysteresis results of a device according to the present invention.
Figure 5:
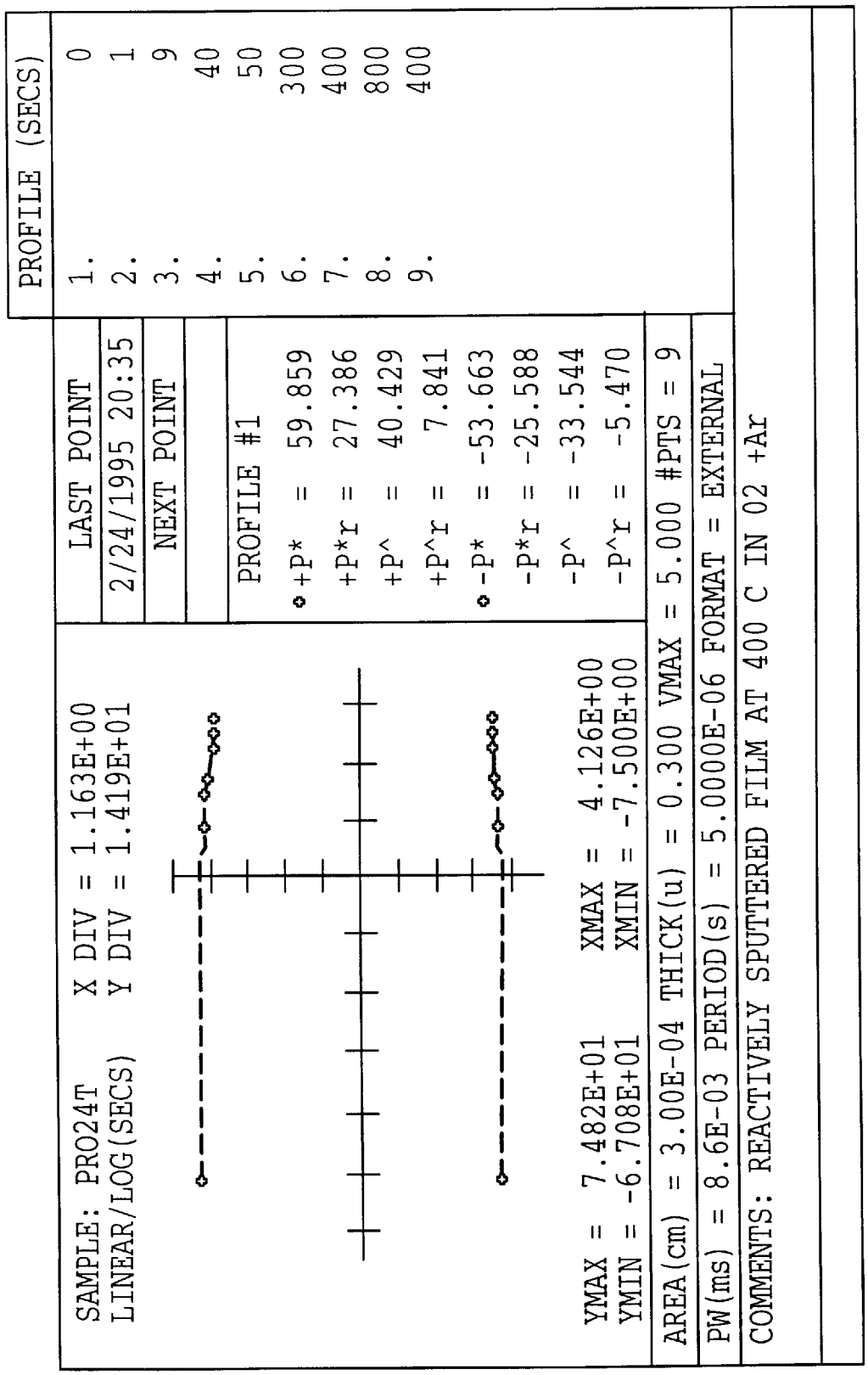
FIG. 5 shows fatigue degradation of a device according to present invention as a result of multiple cycling.

The hysteresis measurements were conducted using a standardized "Radiant Technologies Ferroelectric" tester at an applied voltage of 5V. The films exhibited a remnant polarization of 35 ($\mu C/cm^2$) and a coercive field value of 75 kV/cm (FIG. 4). Fatigue measurements were performed on the samples at an applied voltage of 5V and a frequency of 0.5 MHZ. As indicated in FIG. 5, the films did not show any fatigue degradation up to the measured cycling of $10^{11}$ cycles. Additionally, the samples showed very low leakage current density values (FIG. 6) at an applied field of 100 kV/cm. In particular, the 300 nm thick PZT films showed leakage current density in the range of $10^{-9}$ $A/cm^2$ which is one of the lowest values ever obtained for PZT thin films. FIG. 6 shows the time dependent dielectric breakdown characteristics (TDDB) of PZT samples (at 100 kV/cm) device fabricated by the process of this invention. Clearly, it can be seen that the sample shows very good TDDB characteristics; breakdown occurs only after $10^4$ seconds at 100 kV/cm.

The results on the measurements of the degradation properties clearly indicate that the process of the present invention was successful in overcoming the existing degradation problems with ferroelectric capacitors. While the invention has been described with reference to a specific embodiment, the description is not meant to be construed in a limiting sense. Various modifications of the disclosed embodiment, as well as other embodiments of the invention, will be apparent to persons skilled in the art upon reference to this description. It is therefore contemplated that the appended claims and their legal equivalents will cover any such modifications or embodiments which fall within the true scope of the invention.

What is claimed is:

1. A method of fabricating a ferroelectric capacitor comprising the steps of:
   (a) forming a first metal oxide layer on a face of a substrate to provide an adhesion layer;
   (b) forming a first metal layer on said adhesion layer;
   (c) forming a second metal oxide of said first metal layer on top of said first metal layer formed in step (b);
   (d) forming a layer of ferroelectric material on said second oxide layer formed in step (c),
   (e) forming a third metal oxide on the said ferroelectric layer; and
   (f) forming a second metal layer on said metal oxide layer formed in step (e).

2. A method according to claim 1 wherein at least one of said metal layers is selected from the group consisting of the transition elements.

3. A method according to claim 1 wherein at least one of said metal layers is selected from the group consisting of Pt and Pd.

4. A method according to claim 1 wherein at least one of said metal oxide layers is selected from the group consisting of oxides of transition metals, Pt, Pd, perovskite Rh, Ir, Ru, Os, Pt, Re, and Ag.

5. A method according to claim 1 wherein at least one of the metal oxide layers is a metal oxide of at least one of said metal layers.

6. A method according to claim 1 wherein said ferroelectric material is selected from the group consisting of perovskite oxides, pyrochlore oxides, layered perovskites and tungsten bronze.

7. A method according to claim 1 wherein the said substrate is composed of a material selected from the group consisting of silicon, silicon dioxide, silicon with silicon oxide coating, and gallium arsenide.

8. A method according to claim 1 where said metal layer, metal oxide and ferroelectric layers are deposited by a film physical vapor deposition process.

9. A method according to claim 1 where said metal layer, metal oxide and ferroelectric layers are deposited by a chemical deposition process.

10. A method according to claim 1 wherein said layer of step (b) is composed of the same material as the layer of step (f).

11. A method according to claim 1 wherein said layer of step (b) is of a different material than the layer of step (f).

12. A method according to claim 1 wherein the said metal layers, metal oxides and ferroelectric layers are deposited in-situ.

13. A method according to claim 1 wherein at least one of said metal oxide layers is formed by first depositing one of said metal layers and thereafter annealing said metal layer in an $O_2$ ambient environment.

14. A method according to claim 1, further comprising the step of:
   (g) forming a fourth metal oxide layer on said metal layer formed in step (f).

* * * * *